United States Patent
Rochford et al.

(10) Patent No.: US 7,621,033 B2
(45) Date of Patent: Nov. 24, 2009

(54) METHOD FOR REWORKING A MICROWAVE MODULE

(75) Inventors: Richard A. Rochford, Litchfield, NH (US); Robert F. Madej, Plaistow, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 322 days.

(21) Appl. No.: 10/932,402

(22) Filed: Sep. 2, 2004

(65) Prior Publication Data

US 2005/0171802 A1 Aug. 4, 2005

(51) Int. Cl.
 *B23P 19/00* (2006.01)
(52) U.S. Cl. ............. 29/426.1; 29/402.11; 29/402.21; 29/736; 29/762; 228/4.1; 228/51; 228/264; 228/175; 228/180.22; 705/1

(58) Field of Classification Search ............ 29/402.6, 29/402.11, 402.21, 426.1, 736, 762; 228/4.1, 228/51, 264, 175, 180.22, 219; 705/1
See application file for complete search history.

(56) References Cited

U.S. PATENT DOCUMENTS

| | | | |
|---|---|---|---|
| 4,436,242 A | * | 3/1984 | Shisler et al. ............... 228/264 |
| 5,414,214 A | * | 5/1995 | Cho et al. .................... 174/539 |
| 5,735,450 A | | 4/1998 | Heim et al. |
| 6,347,734 B1 | * | 2/2002 | Downes ................. 228/180.21 |
| 6,845,556 B1 | * | 1/2005 | Liang .......................... 29/840 |

FOREIGN PATENT DOCUMENTS

JP 06328236 A * 11/1994

OTHER PUBLICATIONS

PCT International Search Report dated Oct. 23, 2006 of International Application No. PCT/US05/031724 filed Sep. 2, 2005.

* cited by examiner

*Primary Examiner*—Paul D Kim
(74) *Attorney, Agent, or Firm*—Robert K. Tendler

(57) ABSTRACT

A specialized tool is provided for the removal of components in a microwave module in which a fixed tool having a channeled tip is positioned adjacent the component to be removed, with hot gas from the channeled tip melting the epoxy or solder and with the module forced against the fixed tool to remove it.

6 Claims, 6 Drawing Sheets

METHOD FOR REWORKING A MICROWAVE MODULE

STATEMENT OF GOVERNMENT INTEREST

The invention described herein was made under Contract No. F33657-00-C-0020 with the Government of the United States of America and may be manufactured and used by and for the Government of the United States of America for Governmental purposes without the payment of any royalties thereon or therefore.

FIELD OF THE INVENTION

This invention relates to reworking a microwave electronic part and more particularly to a method and apparatus for quickly removing the damaged component without collateral damage to the remainder of the microwave module.

BACKGROUND OF THE INVENTION

Microwave electronic parts come in modular form in which a number of electronic circuits and components are housed within the walls of a module, which is usually made of metal, plated typically, with gold.

Inside the housing are located a number of electronic components which can be microwave integrated circuits or individual components, which are typically attached to a substrate using epoxies, most notably silver epoxies, which soften at various temperatures. It is characteristic of these epoxies that they have glass transition temperature, above which they soften and are more readily sheared.

These modules, which range in cost between $3,000.00 and $100,000.00, are costly enough such that reworking the modules due to failed components is a priority. In the past, reworking involved the utilization of a chisel and a ball peen hammer in which the faulty component was chiseled off of the substrate. This process took between 30 minutes and a number of hours depending on the complexity of the circuit and the close tolerances involved. Oftentimes rework resulted in collateral damage in which nearby components were damaged by the chiseling and the debris caused by hammering of the chisel into the circuit. The result in some cases is that not only was the originally damaged component removed, but it was oftentimes necessary to remove large portions of the microwave circuitry due to the damage caused by the chiseling in the attempt to rework the module to remove and replace the failed components.

Note that in general, silver epoxy is used for the attachment of semiconductor devices to aluminum and titanium housings and that it was found that a four-ounce ball peen hammer with miniature scalpel blades having chisel-type surgical tips was the preferable way to rework these microwave components.

Note that an additional problem with regard to the removal of the components is the fact that oftentimes the component to be removed is adjacent an isolation wall such that getting a chisel behind the component is often impeded by the presence of the isolation wall.

In a typical prior operation, the module is fixtured in a small vise and positioned underneath a microscope to allow the operator to target or identify the device needing rework. Thereafter, while working under the microscope, the operator would position her chisel on the device and hack the device into thousands of small pieces, which would scatter and litter about the module. Note that the vice was manually positioned and held in place with one hand of the operator, who would hold the vise and the chisel in the same hand to maintain the device in position under the microscope while the operation was performed.

This of course is not only an awkward way of removing the damaged device but also requires great skill in order to be able to hold the chisel and the vise with one hand and hold the hammer in the other hand, all the while peering through the microscope.

Very often the collateral damage not only resulted in the destruction of adjacent devices but also damage to the underlying substrate or housing, which could be gouged severely during the chiseling operation. In such cases it is necessary to scrap the housing and module altogether. Thus, during the rework process it was oftentimes the case that the modules were so severely damaged that the $3,000.00 to $100,000.00 module needed to be replaced with a new module.

It was therefore readily apparent that there was a need for a device that was more surgical in nature, that would result in minimal collateral damage, and would result in a removal of the identified component, oftentimes in seconds as opposed to 30 minutes or more.

SUMMARY OF INVENTION

Rather than utilizing a chisel and a ball peen hammer to mechanically abrade away the defective component, in the subject invention the temperature at the defective component is elevated above its glass transition temperature to reduce the amount of force required to shear the device from its substrate. In order to do so, the tool devised is equipped with a channel used to deliver heated gas directly onto the device under rework, while at the same time avoiding heating adjacent components and causing thermal damage. In one embodiment, the channel runs the length of the tool and is intended for the delivery of heated nitrogen to the defective device.

The module itself in one embodiment is heated by a heated platen on which it rests so that the heat necessary need only be ten degrees greater than the heat of the platen and thus the ambient temperature of the module. This permits applied heat to be confined to an extremely small region, that occupied only by the component in question.

After the component has been heated, with the tool itself fixed and adjacent one edge of the component to be removed, the entire platen with microwave module fixed thereto is moved against the tool. To move the module, one edge of the platen is provided with a stop that butts against one portion of the microwave module. Thus when the platen and stop are moved, the component to be removed moves against the fixed tool. Because the epoxy is softened, the component to be removed is sheared from the substrate by the co-action of one edge of the component with the fixed tool.

In one embodiment, the tool back is relieved so that the tool can be inserted downwardly between a component to be removed and an adjacent isolation wall. This accommodates the close tolerances between components and adjacent walls.

The relief on the tool is necessary to allow for access into microwave modules that are heavily channelized and have multiple isolation walls. It is noted that components in microwave modules will often be very near these isolation walls which inhibits access to the damaged component. Thus the relief in the tool enables one to reach between the component and the isolation wall in order to effect a shear force on the component to be removed.

In one embodiment, the shear force is generated by means of a rotary lead screw that the operator actuates. One literally drives the device under rework and the entire heated platen into the shear tool, which is stationary. When the component is pushed against the stationary sheer tool, a force is exerted and the epoxy yields to the shear force.

The result is that in typical micro-electronic components which use passive elements such as capacitors and active components such as MIMICs and other silicon integrated circuits, the damaged components can be removed in seconds or at most five minutes, whereas with the aforementioned ball peen hammer and chisel approach, the removal could take 30 minutes or more.

Thus, while the subject technique results in virtually no collateral damage, the process can be done in an order of magnitude less time. Not only does the subject system result in a reduced rework time, but also collateral damage is virtually eliminated. This likewise eliminates the necessity of replacing a part damaged by the prior ball peen hammer/chisel method.

It is noted that by providing localized heating via the nitrogen jet, one can heat only the component required to be removed, with the localized heating being on the order of ten degrees greater than the module temperature to bring about a softening of the epoxy or the elevating of the temperature of the epoxy a few degrees above its glass transition temperature. Every epoxy has its unique glass transition temperature and in general two common epoxies have glass transition temperatures respectively 135° C. and 80° C.

Note that collateral damage to adjacent devices is avoided by selecting a tool that is sized in accordance with the device under rework. Also, by careful manipulation of the module in only one direction or the Y-axis in one embodiment, the process is carefully controlled such that only the affected component is removed, with the entire process being performed with the aid of a microscope.

Note that due to the precisely-targeted nitrogen jet that is focused on the device under rework, there is only localized heating of the device, with a rapid dispersion of the heated gas as it deflects off the device under rework preventing an increase in temperature at adjacent components.

In one embodiment the module is held on the platen by gravity and is moved by a front stop with co-acts that an edge of the module, with the front stop being the leading edge of the heated platen or work stage.

In summary, a specialized tool is provided for the removal of components in a microwave module in which a fixed tool having a channeled tip is positioned adjacent the component to be removed. A hot stream of gas, in one embodiment nitrogen, is then forced through the channel onto the top surface of the component to be removed, with the microwave module lying on a heated platen, such that the local increase in temperature at the component to be removed is enough hotter than the ambient temperature of the module as determined by the heated platen to soften the silver epoxy used to mount the component to the module without damaging nearby components. With the fixed tool adjacent the component to be removed and with the component provided with targeted heating, the module is moved against the tool to cause a shear force that moves the component away from its original position, thus breaking the epoxy bond, after which the component is plucked from the module. The subject tool and technique eliminates collateral damage associated with the use of a ball peen hammer and chisel, and results in a tenfold decrease in rework time.

BRIEF DESCRIPTION OF THE DRAWINGS

These and other features of the subject invention will be better understood in connection with a Detailed Description, in conjunction with the Drawings, of which.

DETAILED DESCRIPTION

Figure 1:
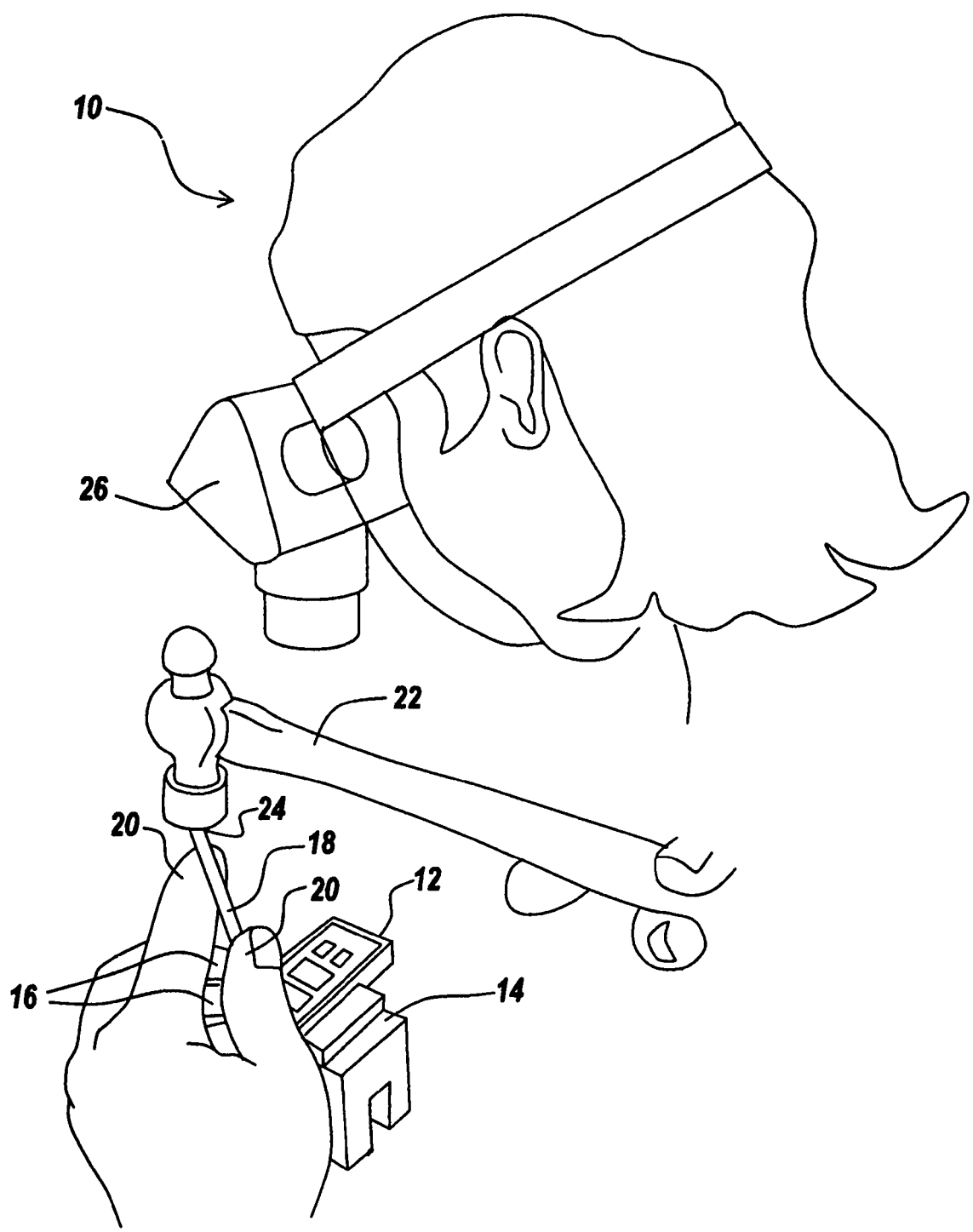
FIG. 1 is a diagrammatic illustration of a prior art technique for the removal of damaged components in a microwave module using a scalpel-like chisel and a ball peen hammer, with the microwave module to be reworked carried in a handheld vise.

Referring now to FIG. 1, in the prior art, an operator 10 is tasked to remove a faulty component from a microwave module 12, which is held in a handheld vise 14 by the individual's fingers 16 of one hand, while a chisel 18 in the form of a miniature scalpel is held by fingers 20 of the individual's same hand. A ball peen hammer 22 strikes the top 24 of chisel 18, with the hammer being manipulated by the other hand of individual 10. All of the above operation takes place under a microscope 26.

What will be appreciated is that aside from collateral damage mentioned before, the manual operation is exceedingly difficult since the operator has to both hold the vise in one hand as well as the chisel while hammering the top of the chisel with the other hand, with all components being in the view of microscope 26.

Figure 2:
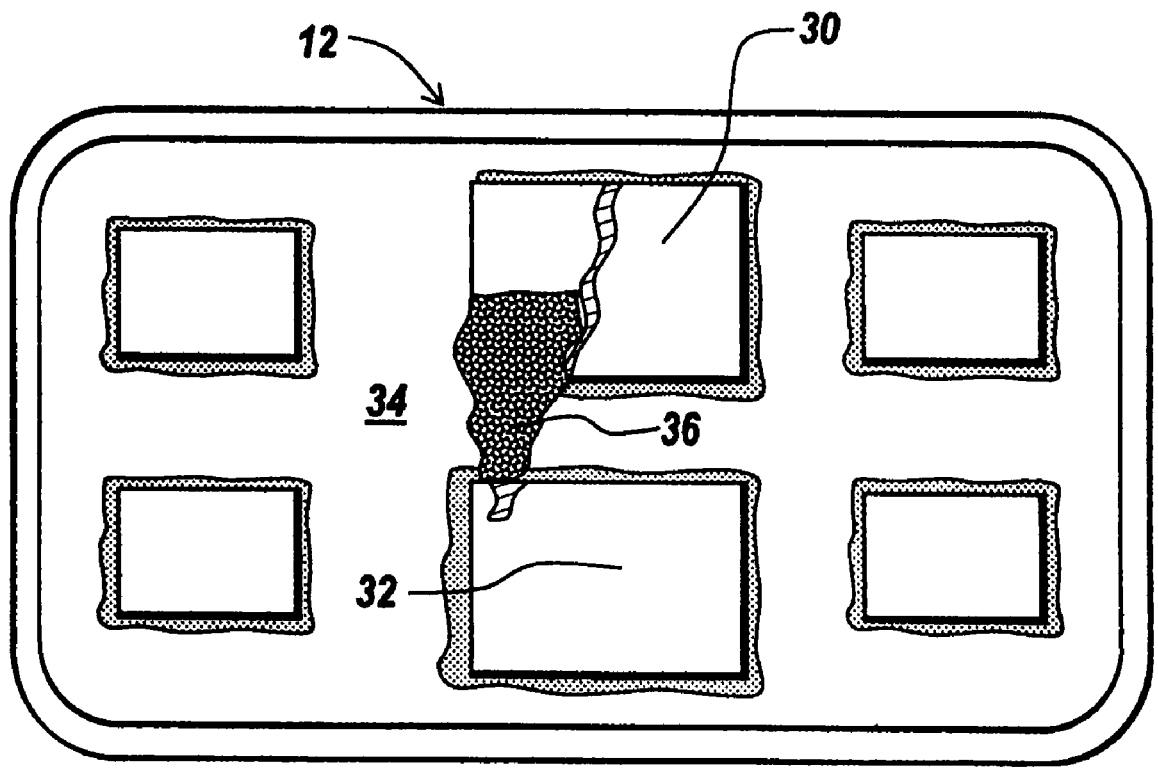
FIG. 2 is a photograph of the type of collateral damage that can be done when using the rework method of FIG. 1, in which not only is there collateral damage to adjacent components, but also the substrate in which the components are mounted is gouged.

As can be seen in FIG. 2, which is a photograph of a module after an attempt to remove a damaged component by the method of FIG. 1, module 12 is left with a fractured component 30, which is the result of having chiseled portions of it from the substrate. Note that collateral damage is evident in terms of damage to an adjacent component 32. Moreover, substrate 34 is shown as having been gouged at 36, which oftentimes means that the microwave component needs to be scrapped.

Even if the microwave component does not need to be thrown out due to the rework process of FIG. 1, the process itself can take 30 minutes or more and requires consummate skill of the operator.

Figure 3:
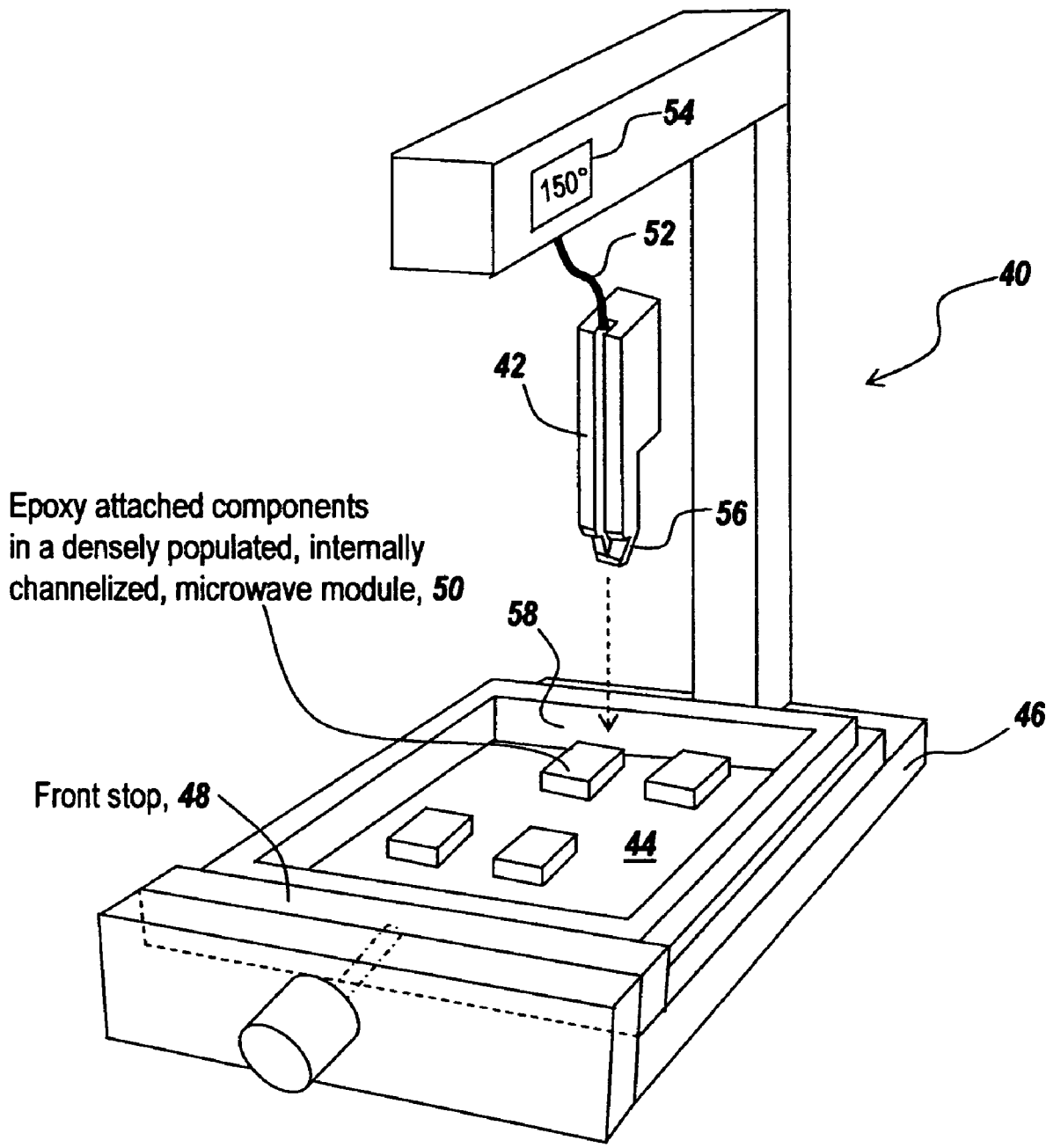
FIG. 3 is a diagrammatic illustration of a tool for the removal of damaged components in a microwave module in which a stream of heated gas in the form of nitrogen is focused onto an epoxy-attached component in a densely populated, intricately channelized microwave module.

Rather than using the method of FIG. 1 and referring now to FIG. 3, a rework machine 40 includes a fixed tool 42 that is positioned over a microwave module 44 that is held in position on a platen 46 by a stop 48.

As illustrated at 50, there is an epoxy-attached component that must be removed from a densely populated, intricately channeled microwave module.

Tool 42 is provided with heated nitrogen gas over a line 52, with the temperature of the gas being controlled displayed at display 54.

As will be discussed, tool 42 is brought down over microwave module 44 so that the tip 56 of tool 42 is positioned against an edge 58 of component 50. With platen 46 being heated and with the localized, focused gas stream from tool 42 being focused onto component 50, the epoxy temperature is raised above its glass transition temperature.

Figure 4:
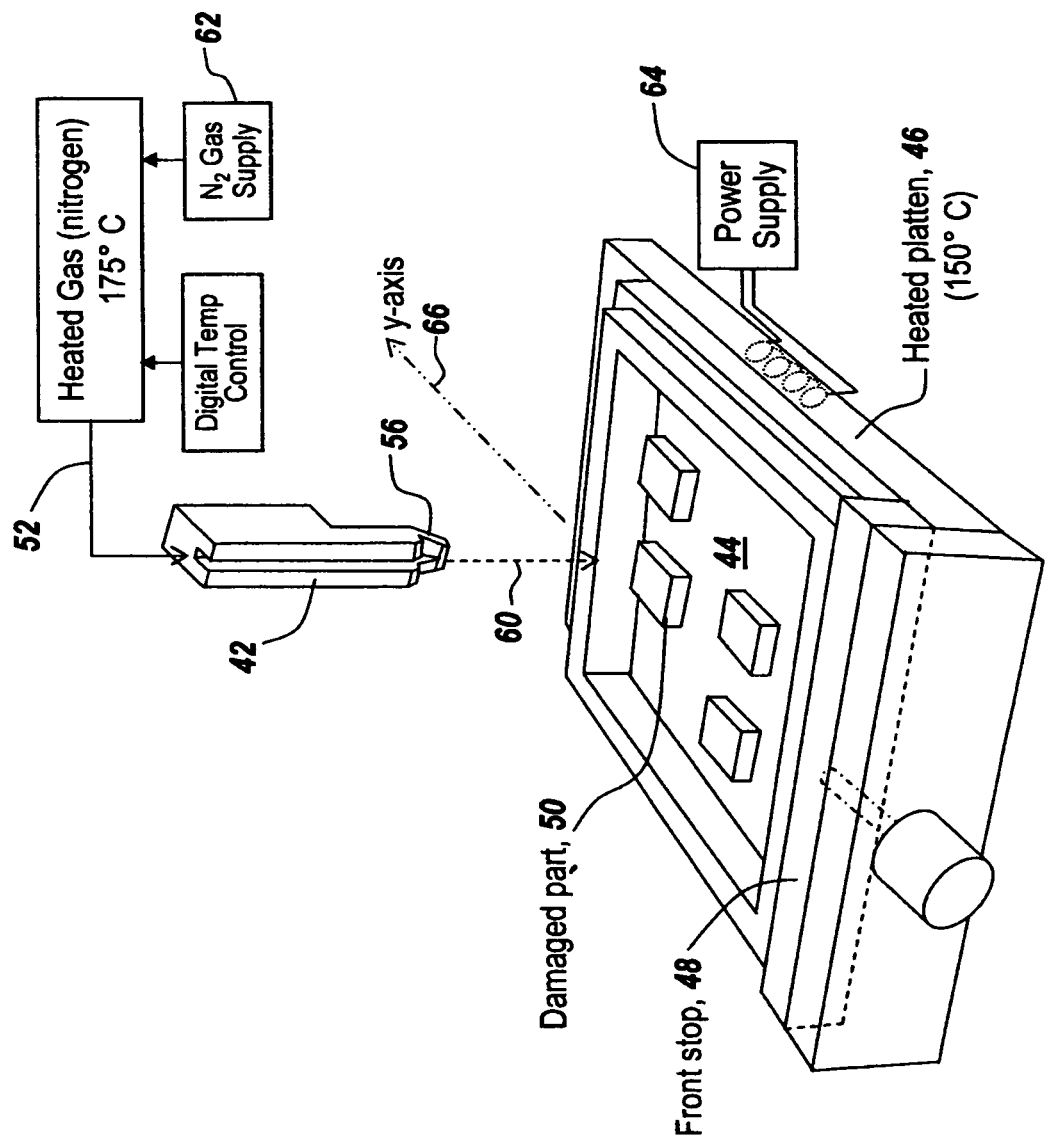
FIG. 4 is a diagrammatic illustration of the tool of FIG. 3, illustrating a fixed tool being brought down to contact a damaged component or part within a microwave module, with heated gas channelized through the tool and directed onto the component to be removed, with the microwave module being situated on a heated platen having a front stop.

More specifically and referring to FIG. 4, in which like elements have like reference characters, it can be seen that tool 42 is brought down as illustrated by dotted line 60 over top of module 44. Here the heated gas stream, in one embodiment at 175° C. from a gas supply 62 is directed onto the damaged part or component to be removed. A heater 64 heats platen 46 to a temperature in one embodiment of 150° C.

Note that platen 46 with stop 48 and module 44 is moved, as will be described, along the Y-axis, here illustrated at 66, against tip 56 of tool 42.

Figure 5:
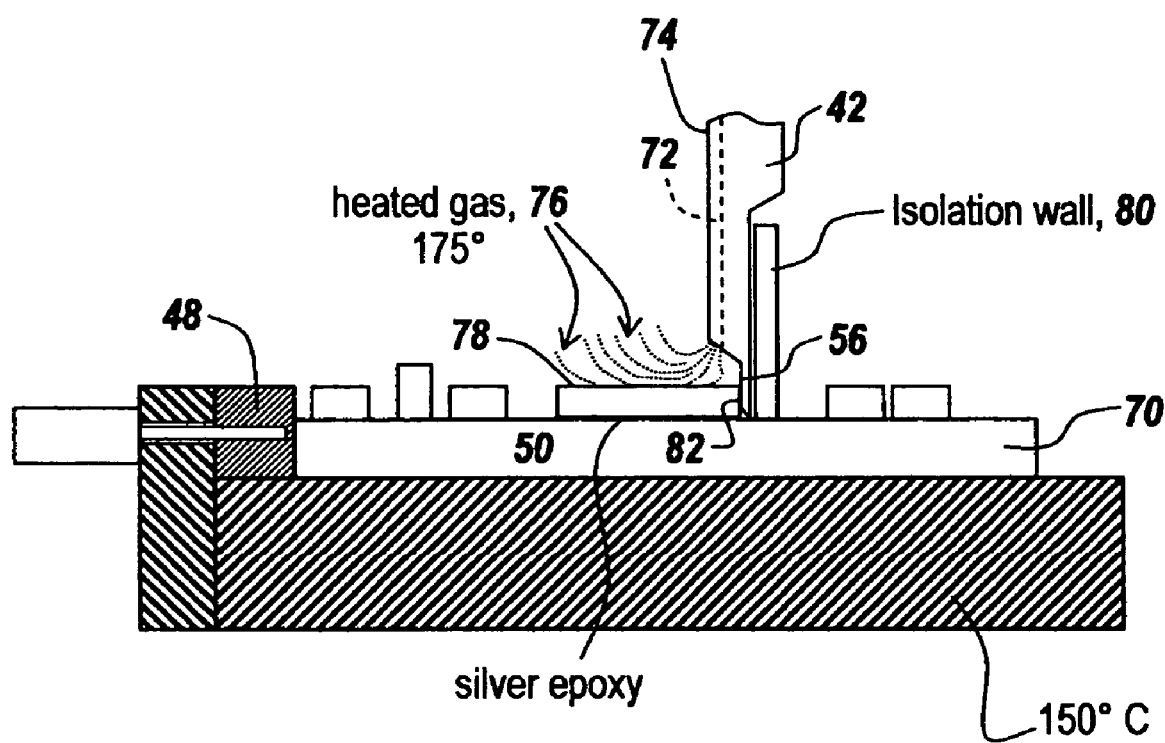
FIG. 5 is a diagrammatic side view of the tool of FIG. 4, illustrating the positioning of the tool of FIG. 4 against an edge of the component to be removed, with heated gas channeled through the tool and down onto the top surface of the component to be removed, with the silver epoxy bonding the component to the substrate being softened, and with the tool having a back surface which is relieved to accommodate an isolation wall adjacent the component to be removed.

Referring now to FIG. 5, component 50 is epoxied into a substrate 70 by a silver epoxy, which is softened due to a temperature rise of, for instance, 25° C. As can be seen, a channel 72 is provided in the leading surface 74 of tool 42, such that heated gas in the form of nitrogen as illustrated by dotted lines 76, impinges on a top surface 78 of device 50. Here it can be seen that the top surface quickly dissipates the heat by dispersing the gas upwardly after impacting the top surface of device 50.

Also shown in this figure is an isolation wall 80, which is closely adjacent component 50. It is important to be able to shape the tool such that tip 56 fits between isolation wall 80 and edge 82 of component 50. In order to provide for the requisite clearance, tip 56 of tool 42 is relieved as illustrated at 84 to provide the requisite clearance, such that in tightly-patterned microwave modules, the tool can be inserted between an adjacent isolation wall and the component to be removed.

Figure 6:
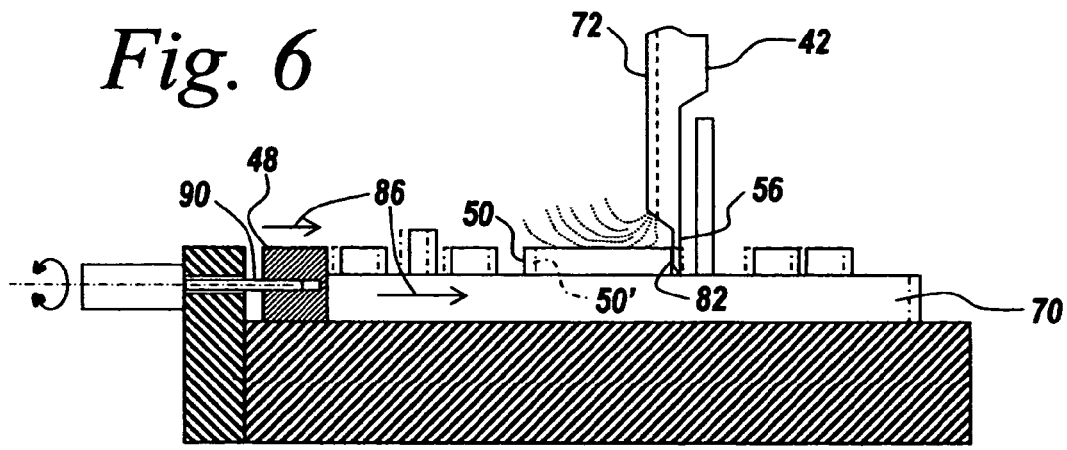
FIG. 6 is a diagrammatic illustration of the position of the tool in FIG. 5 in which the platen with the module thereon is moved against the tool tip, using lead screw actuation.
Figure 7:
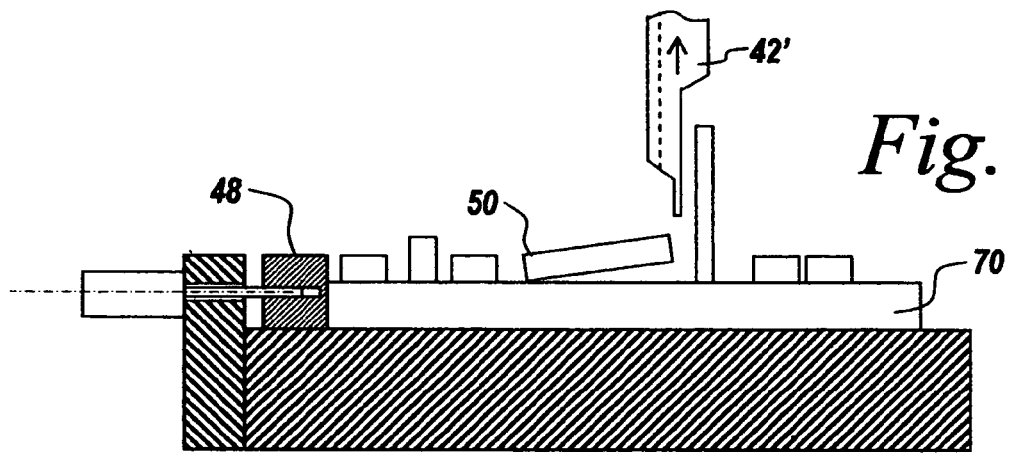
FIG. 7 is a diagrammatic illustration of the movement of the component of FIG. 6, which is sheared from the substrate by its co-action with the tip of the tool of FIG. 6 so that the bond between the component and the substrate is broken; and, FIG. 8 is a diagrammatic illustration of the removal of the sheared component of FIG. 7, in which the sheared component is plucked off the substrate with tweezers.

In operation and referring to FIG. 6, the component 50 to be removed has its contacting edge 82 adjacent tip 56 of tool 42. After component 50 is heated, it is moved in the direction of arrow 86 into the fixed tool tip. This movement is the result of the action of lead screw 90 against stop 48. The rotation of the lead screw thus drives component 50 against fixed tip 56, such that as illustrated in FIG. 7, component 50 pops off of substrate 70. This is because component 50 is moved from its original position 50' to the position shown in FIG. 7, and the tool 42 is removed as illustrated at 42'. As can be seen, movement of component 50 causes shearing of component 50 from substrate 70.

Figure 8:
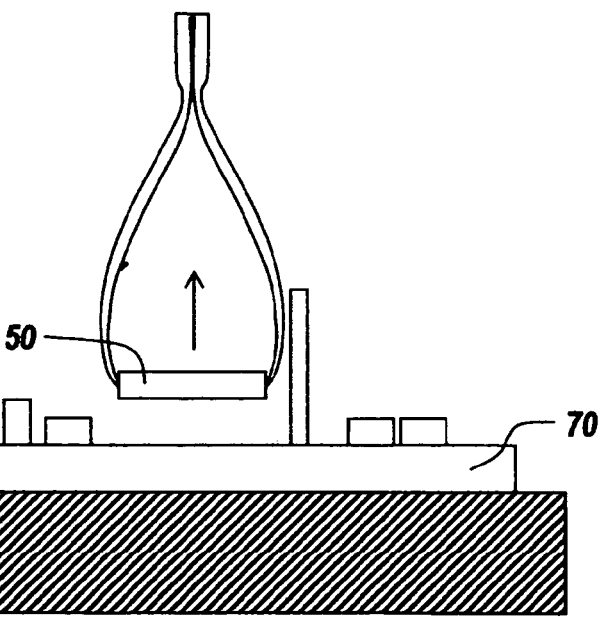

As illustrated in FIG. 8, component 50 may subsequently be plucked off of substrate 70 with tweezers or the like.

As a result, the defective component may be removed from the microwave module and more particularly from the substrate to which it is attached in a matter of seconds or minutes as opposed to multiple minutes, thus reducing the rework time by a factor of ten. Moreover, due to the lack of collateral damage from the localized heating of the damaged component, the number of reworked modules that must be disposed of is minimized, if not virtually eliminated.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for reworking a microwave module having components epoxied to a substrate, comprising the steps of:
   directing a localized jet of hot gas utilizing an elongated guide block with a u-shaped slot in the form of an open slot or notch running along the length of the block that directs the hot gas along the slot to the top surface of a component to be removed from the module until the glass transition temperature of the epoxy is exceeded, thus to at least partially melt the epoxy;
   forcing a side of the component to be removed against a fixed tool that contacts an edge of the component to laterally shear the component from the substrate, the fixed tool including the block;
   plucking the sheared component from the module; and,
   locating the module on a heated platen, the forcing step including moving the heated platen with the component to be removed towards the fixed tool.

2. The method of claim 1, and further including the step of heating the module to a temperature below the glass transition temperature of the epoxy.

3. The method of claim 2, wherein glass transition temperature is only exceeded at the component to be removed due to the localized hot jet.

4. The method of claim 3, wherein the difference in temperature between the module and the localized jet of hot gas is minimized.

5. The method of claim 4, wherein the difference in temperature is 10° C.

6. The method of claim 4, wherein the difference in temperature is 25° C.

* * * * *